United States Patent [19]

Trost

[11] Patent Number: 4,485,339

[45] Date of Patent: Nov. 27, 1984

[54] ELECTRO-MAGNETIC ALIGNMENT DEVICE

[75] Inventor: David Trost, Fairfield, Conn.

[73] Assignee: The Perkin-Elmer Corporation, Norwalk, Conn.

[21] Appl. No.: 502,997

[22] Filed: Jun. 10, 1983

[51] Int. Cl.³ ............................................. G05B 1/06
[52] U.S. Cl. ................................. 318/640; 318/653; 318/687; 269/58; 355/133
[58] Field of Search .................. 355/72, 133; 354/354; 335/222, 223; 318/640, 653, 687; 269/58, 73

[56] References Cited

U.S. PATENT DOCUMENTS 4,087,729 5/1978 Yamazaki et al. .............. 318/640 X

Primary Examiner—Michael L. Gellner
Assistant Examiner—Della J. Rutledge
Attorney, Agent, or Firm—Thomas P. Murphy; Edwin T. Grimes

[57] ABSTRACT

This invention is directed to electro-magnetic alignment devices, which are particularly adapted, among other possible uses, for use in aligning the wafers in a microlithography system, said devices comprising in combination a base plate, a first current carrying coil assembly mounted on the base plate, a second current carrying coil assembly mounted on the base plate in spaced relationship with respect to the first coil assembly, a first magnet mounted adjacent the first coil assembly and a second magnet mounted adjacent the second coil assembly, an upper connecting piece connecting the first and second magnets, a mount for receiving an object on the upper connecting piece, the base plate and magnets and upper connecting piece coacting to form a magnetic circuit, a controller for controlling the flow and direction of current through the coil assemblies to move the magnets and upper connecting piece with respect to the base plate, a plurality of linear actuators mounted between the magnets and the upper connecting piece respectively for moving the connecting piece with respect to the magnets.

10 Claims, 3 Drawing Figures

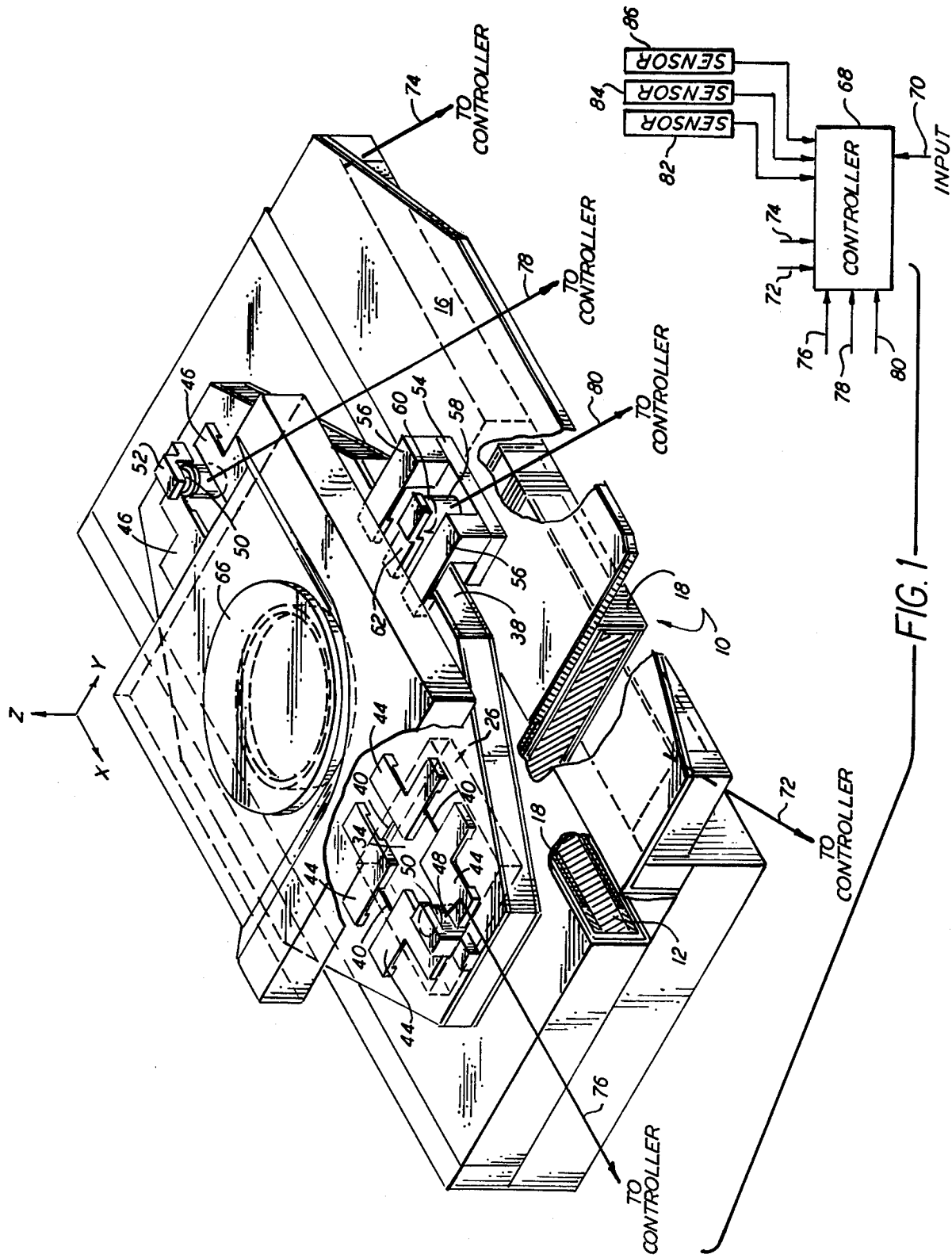

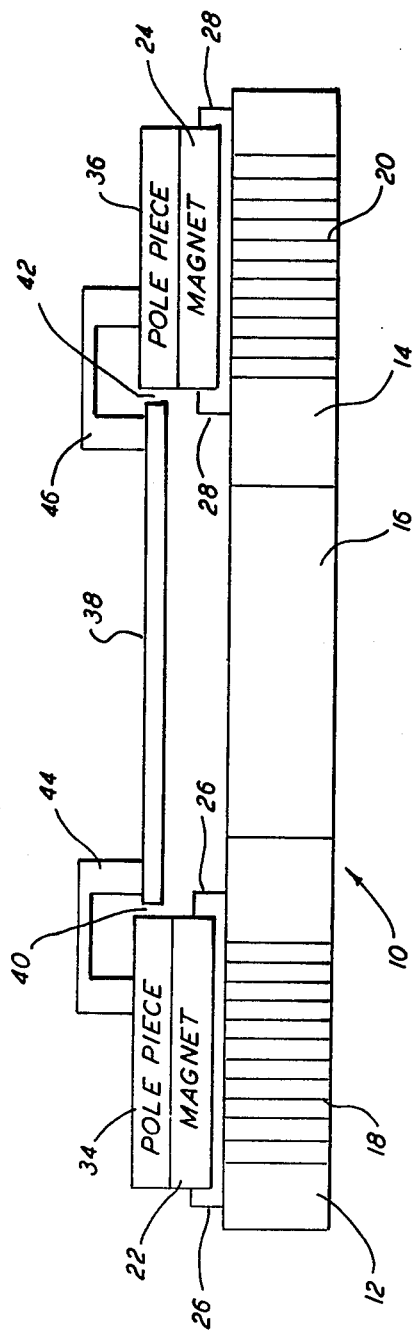
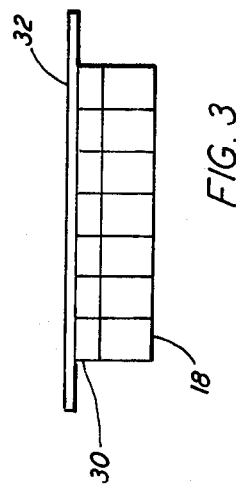

ELECTRO-MAGNETIC ALIGNMENT DEVICE

FIELD OF INVENTION

This application is closely related to application entitled: "Electro-Magnetic Alignment Assemblies", filed on even date herewith and bearing application Ser. No. 502,995 filed June 10, 1983. This application is also closely related to application entitled: "Electro-Magnetic Alignment Apparatus", filed on even date herewith and bearing application Ser. No. 502,998 filed June 10, 1983.

This invention relates to alignment devices and, more particularly, to electro-magnetic alignment devices which are particularly adapted, among many other possible uses, for use in alignment apparatus such as for aligning the wafer or mask in microlithographic projection systems.

BACKGROUND OF THE INVENTION

Conventionally, in order to move an object in three or more degrees of freedom, it was necessary to employ at least three individual linear and/or rotary motors, each driving a single axis stage with the stages cascaded in series with each other. This required a number of appliances with a plurality of bearings supporting large masses which move in different directions. Each bearing having unwanted compliances. This resulted in resonances, friction, backlash and inaccuracy of movement. The lowest mode resonance frequency tended to be much slower than desirable, making high accuracy servo control difficult.

Accordingly, it is a primary object of the present invention to provide a new and improved alignment device, which will become apparent as the description proceeds.

SUMMARY OF THE INVENTION

Briefly, the present invention is directed to a new and improved electro-magnetic alignment device which comprises, in combination, base plate means, a first current carrying coil assembly mounted on said base plate means, a second current carrying coil assembly mounted on said base plate means in spaced relationship with respect to the first coil assembly. In addition, the apparatus comprises first magnetic means mounted adjacent the first coil assembly, second magnetic means mounted adjacent the second coil assembly and connecting means for magnetically connecting the first and second magnetic means. The connecting means includes means for mounting an object thereon. The base plate means, magnet means and connecting means coact to form a magnetic circuit. A controller is provided for controlling the flow and direction of current through the coil assemblies to move the magnet means and the connecting means with respect to the base plate. In addition, according to one aspect of the invention, the connecting means for magnetically connecting the first and second magnet means comprises an upper connecting piece, and flexures connecting the connecting piece to the magnet means. A plurality of linear actuators are mounted between the magnet means and the upper connecting piece for moving the connecting piece with respect to the magnet means, thereby providing an electro-magnetic alignment device which is movable in six degrees of freedom.

According to another aspect of the invention the coil assemblies comprise wire having a square cross section formed into a dense winding with a light machine cut taken across the top. In some installations a thin piece of glass having a lapped surface is interposed between the coil assembly and the magnet means. In some installations a thin layer of thermoset potting material is used in place of the glass.

There has thus been outlined rather broadly the more important features of the invention in order that the detailed description thereof that follows may be better understood, and in order that the present contribution to the art may be better appreciated. There are, of course, additional features of the invention which will be described more fully hereinafter. Those skilled in the art will appreciate that the conception on which this disclosure is based may readily be utilized as a basis of the design of other devices for carrying out the several purposes of the invention. It is important, therefore, that this disclosure be regarded as including such equivalent devices as do not depart from the spirit and scope of the invention.

Several embodiments of the invention have been chosen for purposes of illustration and description and are shown in the accompanying drawings, forming a part of the specification.

BRIEF DESCRIPTION OF THE DRAWINGS

FIG. 1 is a perspective view showing an embodiment of the electro-magnetic alignment device constructed according to the concepts of the present invention;

FIG. 2 is a schematic vertical sectional view showing the relationship between the magnets and the coils of an electro-magnetic alignment device according to the invention; and FIG. 3 is an enlarged sectional view of the coils used in the invention.

DETAILED DESCRIPTION OF THE INVENTION

In the embodiment of the invention illustrated, the new and improved electro-magnetic alignment device comprises base plate means indicated generally at 10 in FIGS. 1 and 2. This base plate means includes a first core plate 12 and a second core plate 14, FIG. 2, which are interconnected by a lower connecting plate 16. These plates are fabricated from a metal such as iron for purposes of carrying a magnetic flux. A first current carrying coil assembly 18 is wrapped around the first core plate 12 and a second current carrying coil assembly 20 is wrapped around the second core plate 14 in spaced relationship with respect to the first coil assembly 18. First magnetic means or a first permanent magnet 22 is mounted adjacent the first coil assembly 18 and a second magnetic means or a second permanent magnet 24 is mounted adjacent the second coil assembly 20. Referring in particular to FIG. 2, the magnets 22, 24 are held just above the surface of the coils 18, 20 by air bearing means indicated at 26, 28 respectively. On top of the coils there is provided a rather flat surface so that the magnet can move smoothly thereon. In order to do this, wire is used which has a square cross section as seen in FIG. 3, so that it can be formed into a very dense winding, e.g., almost like solid material. A series of windings a couple of layers thick are formed and when this is done a light machine cut is taken across the top, as indicated at 30, to provide a very smooth surface. In some installations a very thin piece of glass 32 is mounted on top of the coils, which can be lapped to any desired smoothness. Referring again to FIG. 2, pole pieces 34 and 36 are mounted on top of the magnets 18 and 20, respectively, so that magnetic flux flows out of the magnet into the pole pieces. The magnets 22 and 24 are magnetically connected with an upper connecting piece 38 of iron or other magnetic material. There is a small gap 40 extending all the way around the pole piece 34, as well as a small gap 42 extending all the way around the pole piece 36. However, the magnetic flux readily crosses these small gaps. The two magnets 22 and 24 are so disposed that they are magnetized in opposite directions so that they do not fight each other, and as a result, there is a single magnetic circuit formed where the magnetic flux runs around the whole loop, including the two magnets 22, 24, the two pole pieces 34, 36, the upper connecting piece 38 and the lower connecting piece or base 16.

The magnets through their pole pieces 34 and 36 are mounted by means of flexures 44 and 46, respectively. For each magnet eight flexures are employed. They are simple blades that bend in the middle to allow the upper connecting piece 38 to flex up and down while the magnets remain in stationary vertical position with respect to the coils. The flexures are connected to bridge the gap 40 and 42 between the pole pieces and the upper connecting piece 38.

As best seen in FIG. 1, a small linear actuator is mounted adjacent each magnet. The bottom of the body 48 of the actuator is fixedly mounted on the air pad or air bearing 26, while the coil assembly 50 of the actuator is attached to a little arm 52 that is fixedly attached to the upper connecting piece 38. The device is provided with a third air bearing, as seen in FIG. 1, which includes an air pad 54 that is connected by flexure 56 to the upper connecting piece 38. A third actuator is provided having a body 58 mounted on the air pad 54 and having a coil assembly 60 attached to a little arm 62 which is connected to the upper connecting piece 38. As a result, in operation the actuators move the upper connecting piece up and down while the flexures flex slightly, but hold the components together. The magnetic flux crosses the gaps 40 and 42. The pole pieces 34 and 36 are made a little bit thicker than the upper connecting piece 38 so that they are always opposite each other and thereby allow freedom of motion between the pole pieces and connecting piece. That is, the little actuator moves perpendicular to the flux and hence avoids pulling against the large force of the magnet. Any suitable linear actuator may be employed such as, for example, a linear actuator, having a moving coil, having a SmCo magnet as manufactured by Kimco of San Marcos, Calif. 92069 and bearing model no. LA 10-12.

Mounted on the upper connecting piece 38 is a large mirror 64 for use in conjunction with a laser interferometer that measures position. Centrally mounted on the upper connecting piece 38 is an object mounting means 66 where a wafer, for example, can be mounted.

In operation, as pointed out hereinbefore, a magnetic circuit is formed which has a magnetic flux that follows a path around a single loop including the two magnets 22, 24, the two pole pieces 34, 36, the upper connecting piece 38 and the lower connecting piece 16. The coils 18 and 20 pass through the gaps between the magnets 22 and 24 and the core plates 12, 14, respectively. The magnetic flux bridges these gaps and by modifying the flux in these areas with electric currents passing through the coils, a variety of forces may be produced on the movable upper connecting piece 38 and the object mounting means 66. A controller 68 is provided which may be of any suitable type. For example, it may have an input 70 through which either manually or by microprocessor a command is given directing the upper connecting piece 38 and hence the wafer to move to a specific position. The coil 18 is connected to the controller 68 by a lead 72 and the coil 20 is connected to the controller by a lead 74. By controlling the direction and flow of current in the coils 18 and 20, the upper connecting piece 38 and the object mounted thereon can be moved in the X direction and the Y direction or rotated about the Z axis as viewed in FIG. 1. The above indicated force or movements is explained by Newton's third law, i.e., "Every force has an equal and opposite force" (or reaction). Current flowing through the wire exerts a lateral force on the wire when the wire is in a magnetic field. A "reaction force" is produced in the pole pieces which carry the magnetic field. In the present instance, since the fixed elements, core plates 12 and 14 and lower connecting plate 16, can not move, the magnets 22, 24, pole pieces 34 and 36 and upper connecting piece 38 are forced to move. They, of course, carry the wafer mounted thereon. The movement just described provides three degrees of wafer motion in a single plane. For purposes of giving the wafer out of plane motion, the three linear actuators are provided. Each actuator is provided with a lead 76, 78, 80 to the controller 68, FIG. 1. By controlling the direction and flow of current to the coils 50 and 60 of the linear actuators, the upper connecting piece 38 and wafer mounted thereon can be made to go up, down or tilt, as desired. Further, the device is provided with sensors 82, 84 and 86, FIG. 1, which in cooperation with the mirror 64 input into the controller 68 the exact position of the upper connecting piece 38 and, of course, the wafer mounting means 66. As a result, an electro-magnetic alignment device is provided, which has six degrees of freedom that are very accurately controlled.

Although certain particular embodiments of the invention are herein disclosed for purposes of explanation, further modification thereof, after study of this specification will be apparent to those skilled in the art to which the invention pertains. Reference should accordingly be had to the appended claims in determining the scope of the invention.

What is claimed is:

1. An electro-magnetic alignment device comprising, in combination:
   base plate means,
   a first current carrying coil assembly mounted on said base plate means,
   a second current carrying coil assembly mounted on said base plate means in spaced relationship with respect to the first coil assembly,
   first magnet means mounted adjacent said first coil assembly,
   second magnet means mounted adjacent said second coil assembly,
   connecting means magnetically connecting the first and second magnet means,
   means for mounting an object on said connecting means,
   said base plate means and said magnet means and said connecting means coacting to form a magnetic circuit, and
   means for controlling the flow and direction of current through said coil assemblies to move said two magnet means and said connecting means with respect to said base plate means.

2. An electro-magnetic alignment device according to claim 1 wherein said base plate means comprises a first core plate, about which said first coil assembly is wound, and a second core plate, about which said second coil assembly is wound, and a lower connecting plate magnetically connecting said core plates.

3. An electro-magnetic alignment device according to claim 1 further comprising air bearing means for mounting said magnet means on said coil assemblies, respectively.

4. An electro-magnetic alignment device according to claim 3 wherein each of said coil assemblies comprises wire, having a square cross section, formed into a dense winding with a light machine cut taken across the top.

5. An electro-magnetic alignment device according to claim 4 further comprising a thin piece of glass having a lapped surface interposed between the coil assemblies and the magnet means, respectively.

6. An electro-magnetic alignment device according to claim 3 further comprising a thin layer of potting material having a lapped surface interposed between the coil assemblies and magnet means, respectively.

7. An electro-magnetic alignment device according to claim 1 wherein said connecting means magnetically connecting the first and second magnet means comprises an upper connecting piece, and flexures connecting the connecting piece to the magnet means.

8. An electro-magnetic alignment device according to claim 7 further comprising a plurality of linear actuators mounted between the magnet means and the upper connecting piece for moving the connecting piece with respect to the magnet means.

9. An electro-magnetic alignment device according to claim 8 further comprising a plurality of sensor means for sensing the position of said connecting piece, said sensor means providing inputs to said means for controlling.

10. An electro-magnetic alignment device comprising, in combination:
base plate means,
a first current carrying coil assembly mounted on said base plate means,
a second current carrying coil assembly mounted on said base plate means in spaced relationship with respect to the first coil assembly,
first magnet means mounted adjacent said first coil assembly,
second magnet means mounted adjacent said second coil assembly,
air bearing means for mounting said magnet means on said coil assemblies, respectively,
connecting means magnetically connecting the first and second magnet means,
said connecting means magnetically connecting the first and second magnet means including an upper connecting piece and flexures connecting the connecting piece to the magnet means, means for mounting an object on said upper connecting piece, said upper connecting piece being disposed so that a gap is formed between said upper connecting piece and said magnet means, respectively,
said base plate means and said magnet means and said upper connecting piece coacting to form a magnetic circuit,
a plurality of linear actuators mounted between the magnet means and the upper connecting piece for moving the connecting piece with respect to the magnet means, means for controlling the flow and direction of current through the coil assemblies to move said magnet means and said upper connecting piece with respect to said base plate means, and means for controlling the direction and flow of current to said linear actuators for moving the connecting piece with respect to the magnet means,
a plurality of sensor means for sensing the position of said connecting piece, said sensor means providing inputs to said controller.

* * * * *